United States Patent [19]
McAndrews et al.

[11] Patent Number: 5,886,503
[45] Date of Patent: Mar. 23, 1999

[54] BACK-UP BATTERY MANAGEMENT APPARATUS FOR CHARGING AND TESTING INDIVIDUAL BATTERY CELLS IN A STRING OF BATTERY CELLS

[75] Inventors: Joseph M. McAndrews, Freeport, N.Y.; Richard H. Jones, Marietta, Ga.

[73] Assignee: PECO II, Inc., Galion, Ohio

[21] Appl. No.: 878,914

[22] Filed: Jun. 19, 1997

Related U.S. Application Data

[63] Continuation-in-part of Ser. No. 654,835, May 29, 1996.

[51] Int. Cl.$^6$ ................................................ H01M 10/46
[52] U.S. Cl. .......................................... 320/121; 320/134
[58] Field of Search .................................. 320/116, 118, 320/122, 121, 134, 136, 114, 117, 129, 138, 147; 324/426, 427, 429, 430, 434; 307/19, 46, 47, 65, 66

[56] References Cited

U.S. PATENT DOCUMENTS

| | | |
|---|---|---|
| 1,343,597 | 6/1920 | Turbayne . |
| 1,931,867 | 10/1933 | Holden et al. .......................... 171/314 |
| 2,062,274 | 11/1936 | Rees .......................................... 171/97 |
| 2,316,331 | 4/1943 | Hedding .................................. 175/363 |
| 2,334,528 | 11/1943 | Amsden .................................... 171/97 |
| 2,398,845 | 4/1946 | Mullerheim ................................ 179/77 |
| 2,653,252 | 9/1953 | Ostendorf, Jr. ............................ 307/64 |
| 2,675,490 | 4/1954 | Portail ...................................... 307/48 |
| 3,505,531 | 4/1970 | Wattson .................................... 307/64 |
| 3,585,482 | 6/1971 | Zelina ....................................... 320/39 |
| 3,594,628 | 7/1971 | Webster et al. ........................... 320/13 |
| 3,599,071 | 8/1971 | Enghlen et al. ........................... 320/35 |
| 3,710,134 | 1/1973 | Guthart ..................................... 307/66 |
| 3,784,892 | 1/1974 | Zelina ....................................... 320/40 |
| 3,854,082 | 12/1974 | Nasby et al. .............................. 320/22 |
| 3,864,617 | 2/1975 | Smith et al. ............................... 320/23 |
| 4,096,394 | 6/1978 | Ullmann et al. ........................... 307/46 |
| 4,131,841 | 12/1978 | Bennefeld ................................. 320/23 |
| 4,220,872 | 9/1980 | Fahey ........................................ 307/32 |
| 4,238,721 | 12/1980 | DeLuca et al. ........................... 320/122 |
| 4,384,214 | 5/1983 | Crick et al. ............................... 307/66 |
| 4,399,396 | 8/1983 | Hase .......................................... 320/43 |
| 4,467,265 | 8/1984 | Hierholzer, Jr. ........................... 320/17 |
| 4,471,233 | 9/1984 | Roberts .................................... 307/66 |
| 4,476,425 | 10/1984 | Chernotsky et al. ..................... 320/39 |

(List continued on next page.)

FOREIGN PATENT DOCUMENTS

| | | |
|---|---|---|
| 0 348 839 A1 | 1/1990 | European Pat. Off. . |
| 0 616 226 A1 | 9/1994 | European Pat. Off. . |
| 40 33 444 A1 | 10/1990 | Germany . |
| 2 243 695 | 11/1991 | United Kingdom . |

OTHER PUBLICATIONS

*Method For Dynamic Test Of A Battery Backup In A System Environment,* IBM Technical Disclosure Bulletin, vol. 36, Nov., 1993.

*A Valve Regulated Lead Acid Battery Management System (VSM),* Joseph M. McAndrews and Richard H. Jones, Oct. 6, 1996.

*PCT International Search Report* dated Aug. 10, 1998.

Printout of Web–Site of *AIMS Computer Systems and Support Services* dated Sep. 19, 1997.

*Primary Examiner*—Edward H. Tso
*Attorney, Agent, or Firm*—Marshall, O'Toole, Gerstein, Murray & Borun

[57] ABSTRACT

An apparatus for controllably charging and discharging individual battery cells or groups of battery cells in a string of batteries employed as a back-up power supply is provided. The apparatus comprises an isolation circuit for at least partially isolating the battery string from the load bus and primary supply; a switching network including at least two controlled switches arranged to selectively form circuits for discharging one or more cells; and a logic circuit for selecting which of the cells will be discharged. In certain disclosed embodiments, the logic circuit and switching network combine to apportion charging current to individual battery cells or groups of cells in accordance with their charging needs.

41 Claims, 6 Drawing Sheets

U.S. PATENT DOCUMENTS

| | | | |
|---|---|---|---|
| 4,484,140 | 11/1984 | Dieu | 324/434 |
| 4,670,661 | 6/1987 | Ishikawa | 307/66 |
| 4,675,538 | 6/1987 | Epstein | 307/64 |
| 4,686,379 | 8/1987 | Ohnari | 307/66 |
| 4,760,322 | 7/1988 | Crampton | 320/14 |
| 4,761,563 | 8/1988 | Ross et al. | 307/87 |
| 4,965,462 | 10/1990 | Crawford | 307/66 |
| 5,049,805 | 9/1991 | Celenza et al. | 323/285 |
| 5,093,624 | 3/1992 | Stevenson | 324/426 |
| 5,126,585 | 6/1992 | Boys | 307/66 |
| 5,126,588 | 6/1992 | Reichmeyer et al. | 307/270 |
| 5,153,496 | 10/1992 | LaForge . | |
| 5,160,851 | 11/1992 | McAndrews | 307/66 |
| 5,250,904 | 10/1993 | Salander et al. | 324/430 |
| 5,268,845 | 12/1993 | Startup et al. | 364/483 |
| 5,343,380 | 8/1994 | Champlin | 363/46 |
| 5,376,828 | 12/1994 | Kim et al. | 307/64 |
| 5,387,871 | 2/1995 | Tsai | 324/429 |
| 5,422,560 | 6/1995 | Yan | 320/31 |
| 5,469,043 | 11/1995 | Cherng et al. | 320/31 |
| 5,514,915 | 5/1996 | Kim et al. | 307/64 |
| 5,543,245 | 8/1996 | Andrieu et al. | 429/90 |

| K | A | B | C | D | E | F |
|---|---|---|---|---|---|---|
| 1 | X | X | X |   |   |   |
| 2 |   | X |   |   | X |   |
| 3 |   |   | X |   |   |   |
| 4 |   |   | X |   |   |   |
| 5 | X | X |   |   | X |   |
| 6 | X | X | X | X |   |   |

BACK-UP BATTERY MANAGEMENT APPARATUS FOR CHARGING AND TESTING INDIVIDUAL BATTERY CELLS IN A STRING OF BATTERY CELLS

RELATED APPLICATIONS

The instant application is a continuation-in-part of U.S. Pat. application Ser. No. 08/654,835, field May 29, 1996.

FIELD OF THE INVENTION

The present invention relates generally to back-up battery management systems and more particularly to a back-up battery management apparatus for charging and testing individual battery cells in a string of battery cells.

BACKGROUND OF THE INVENTION

In telephone switching equipment, communication equipment, computer equipment, and in many other applications, the need for an uninterrupted source of DC power is critical. Rectified commercial AC power is typically used as the primary source of DC power for such equipment.

To avoid any interruption or outage in power service, it is common practice to employ a battery back-up for the primary DC source. Back-up battery systems typically include strings of batteries or cells connected in parallel with the primary DC source and the load. In the event of a drop in the load bus voltage below a predetermined threshold, the back-up battery supplants or supplements the primary source of DC power. Back-up battery systems are designed to replace the primary DC power source for a predetermined period of time within which resumption of primary power is expected to occur.

In conventional back-up battery systems, the nominal system load bus voltage has typically been dictated by battery characteristics. For example, in a telephone switching plant, back-up batteries are commonly employed which have a design cell voltage of −2.26 volts, for optimum health of the battery cell. Twenty-four cells are typically combined in a string, resulting in a nominal load bus voltage of approximately −54 volts. A bank of strings supplies the necessary back-up DC power.

As the back-up batteries are placed across the load, the full 54 volts of system DC voltage are placed across the battery string. This design architecture of a typical back-up battery system presents a number of potential problems. Certain batteries, due to their electrochemical constitution, will draw more current than other batteries. All batteries, as they age, will experience increasing internal resistance and will draw more charging current from the main DC supply.

About a decade ago, a new type of lead acid battery was introduced into the marketplace. The battery is sealed, and allegedly requires no maintenance. In this type of battery, oxygen and hydrogen produced during electrochemical reactions in the battery recombine to maintain an aqueous liquid electrolyte at a constant level within the cell. As a result, these batteries have only a small amount of liquid electrolyte. These batteries have become known as "valve regulated", or "recombinant"or "electrolyte-starved" batteries.

This type of lead acid battery (hereinafter termed "valve regulated lead acid " or "VRLA" batteries) has often failed well before their design life, which is typically 10 years.

A particular battery may, for various reasons not clearly understood, begin to take on more amperage to maintain its charge. The increasing charging current will elevate the temperature of the battery. The chemical recombination of the oxygen and hydrogen gases also creates heat. As the internal battery temperature increases, the current demand increases disproportionately. For every 10 degrees centigrade of increase in the battery's internal temperature, the current demand doubles. A battery in this condition will have one of two failure modes, the most damaging being "thermal runaway." Thermal runaway may lead to an explosion of the battery, with likely destruction or severe damage to any nearby equipment. Alternatively, the battery may experience a "melt down" and produce noxious gases which are also apt to damage or destroy neighboring equipment.

The rectified AC source provided in typical telephone switching plants has more than ample capacity to supply any one or more batteries demanding abnormal charging current, thus encouraging the aforedescribed thermal runaway or meltdown failures.

With the advent of fiber optic signal distribution, switching equipment has been decentralized, introducing a need for DC power supplies in unattended satellite installations distributed throughout the territory served. In these unattended installations, the equipment is often closely packed, leading to hostile thermal operating conditions for the equipment and increased occurrences of thermally induced failures.

In less severe conditions, the placement of the back-up batteries directly across the load is apt to result in dry-out (loss of electrolyte), positive grid corrosion, and other problems which may lead to premature battery failure and/or sub-normal power performance.

Back-up battery systems must be monitored to determine the health and capacity of the batteries. The need to perform battery tests is particularly troublesome in systems which require the supply of an uninterrupted source of DC power. Testing of the vital statistics of a battery affecting output capacity, predicted life, etc. is presently done by taking the battery strings off-line and testing them in one of two ways. The test procedure recommended by battery manufacturers as being the most reliable is to discharge the battery into a load while measuring the response of the battery. The ability of a battery or battery string to hold a predetermined current level for a predetermined time is a reliable measure of the health and capacity of the battery. However, such discharge tests in the field require experienced personnel and are difficult and costly. Further, conventional battery testing, requiring the batteries to be taken offline, suffers a loss of standby battery protection for the telephone plant or other equipment being supplied while the tested batteries are off-line.

To avoid the cost and inconvenience of a discharge test, it is commonplace to employ special field test equipment which tests for battery resistance, impedance, inductance, and other parameters and characteristics without discharging the battery. See U.S. Pat. No. 5,250,904. However, as noted, tests which do not involve discharging the battery are apt to be less reliable.

U.S. Pat. No. 5,160,851 to Joseph M. McAndrews, one of the present inventors, discloses a back-up battery system for telephone central office switching equipment. The back-up battery system includes one or more rechargeable batteries having cells floated at a given float voltage. The cells are of a number such that when the batteries are switched in circuit across the load, the cumulative voltage of the batteries exceeds a predetermined load voltage for a preselected period. The over-voltage that results from the switching in of extra cells across the load is down converted by a converter. The converter, a sensor for sensing the system discharge bus voltage, and a switch may be formed as a single unit using MOSFET technology. It is said that in such case a fail-safe contact switch might also be provided to parallel the MOSFET switch and be operated in the event of its failure.

SUMMARY OF THE INVENTION

The present invention overcomes the drawbacks of the prior art by providing an apparatus for selectively testing battery cells in a string of battery cells employed as a back-up power supply to a primary power source. The apparatus comprises an isolation circuit for at least partially isolating the string of battery cells from the load bus while permitting current flow between the battery cells and the load bus in the event of a failure of the primary power supply. The apparatus further includes a switching network including at least two controlled switches arranged to selectively form circuits for discharging one or more of the battery cells while the cells remain connected in the string; and, a logic circuit connected to the controlled switches for selecting which of the battery cells will be discharged for testing.

In one preferred embodiment of the invention, the switching network of the apparatus comprises: a first connection between a first one of the controlled switches and a first terminal of a first one of the battery cells; a second connection between the first controlled switch and a first terminal of a second one of the battery cells; a third connection between a second one of the controlled switches and a second terminal of the first battery cell; and, a fourth connection between the second controlled switch and a second terminal of the second battery cell. In the preferred embodiment, the apparatus is also provided with a discharge module for selectively connecting the switching network to a load for discharging the battery cell selected by the logic circuit. The discharge module is preferably coupled to the first controlled switch and the second controlled switch is preferably connected to ground such that the logic circuit can manipulate the first and second controlled switches to form: (1) a first discharge path comprising the discharge module, the load, the first battery cell and the first and second controlled switches, and (2) a second discharge path comprising the discharge module, the load, the second battery cell and the first and second controlled switches.

In another preferred embodiment, each of the controlled switches of the apparatus is connected to selectively form a circuit for shunting charging current to ground from an associated battery cell in the string of battery cells. In this embodiment, the logic circuit can adjust the state of the controlled switches to vary the amount of charging current shunted to ground from their associated battery cells to permit individualized charging of the different cells. Also in this embodiment, the logic circuit can close one or more of the controlled switches to independently discharge battery cells in the string.

DESCRIPTION OF THE PREFERRED EMBODIMENTS

Figure 1:
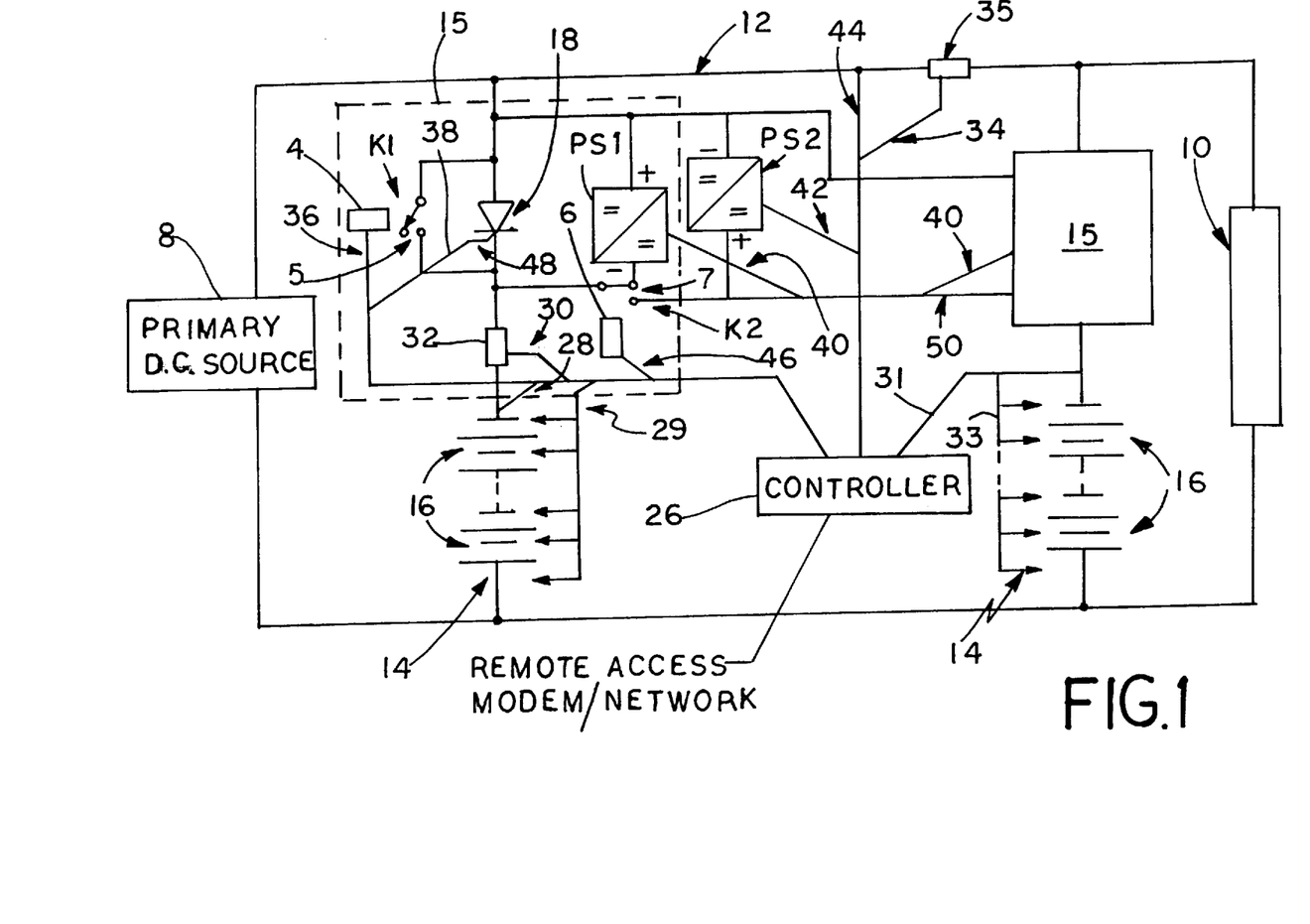
FIG. 1 is a schematic block diagram of a back-up battery management apparatus shown in an environment of use.

A primary DC source 8 for supplying DC power to a system load 10 through a system load bus 12 is illustrated in FIG. 1. The primary DC source 8 may comprise a conventional system for developing rectified DC power from a commercial source of AC power.

A system for use in a telephone switching office may employ a bank of battery strings. In the embodiment illustrated in FIG. 1, two exemplary strings of batteries are shown schematically at 14. In a typical installation, each battery string comprises a number of cells or groups of cells (termed "monoblocks") 16 herein sometimes referred to as "cells/monoblocks". As noted, each cell may produce, for example, -2.26 volts. In a bank of 24 cells, a total of approximately -54 volts DC is developed.

Basic components of the illustrated battery management system are contained within a battery string module 15. An important component of the battery string module 15 is a variable isolation impedance connected in series with the battery strings 14. (As used herein, the terms "battery" and "battery string" are used interchangeably to mean any series of battery cells, irrespective of their particular construction.)

The function of the isolation impedance, here shown as a thyristor or SCR 18, is to electrically isolate the battery strings 14 from the system load bus 12. As will become evident from the ensuing description, having isolated the battery strings 14 from the system load bus 12, a variety of benefits can be realized that are not available to prior art back-up battery management or monitor systems in which the battery strings are placed directly across the load. As explained above, placement of the battery strings across the load and subject to the primary DC source sets up conditions for thermal runaway, accelerated positive grid corrosion and electrolyte dry-out in VRLA batteries, for example, and establishes conditions for performance and reliability degradation in batteries of other types.

As will be explained in the following text, the battery management system of FIG. 1 makes possible controlled charging of the battery strings at a rate which is constant at a given time and for a given condition of the battery cells/monoblocks to avoid the potential for thermal runaway and the other performance and reliability degrading problems which plague prior systems. Further, these benefits are achieved without depriving the battery strings of their capability of supplying emergency DC power to the load in the event of an outage or drop in the primary DC source output voltage.

Any of a number of circuit structures and components may be employed to implement the variable isolation impedance means which have a high reverse impedance and a variable forward impedance. In the preferred embodiment illustrated in FIG. 1, a shunted gated silicon device is employed—as noted, here shown as an SCR (silicon controlled rectifier) 18.

A shunting contactor set K1, comprising a normally closed relay 4 actuating a set of switch contacts 5, is connected in parallel with the SCR 18 and connects the battery strings 14 to the system load bus 12 under certain conditions, as will be explained. The shunting contactor set K1 has break-type (normally closed) contacts, thus connecting the battery strings 14 to the system load bus 12 in the event that the contactor set K1 or its control fails.

A float/boost power converter PS1 is connectable in series with the battery strings 14 to provide a constant maintenance or "float" current to float charge the battery strings 14. The converter may be of conventional construction, with the addition of circuitry to make possible the application of a constant voltage across the battery cells/monoblocks and control of battery current, as will be described hereinafter. The level of float current is dependent upon the type, size, and age of the battery. As will be explained, under normal operating conditions the SCR 18 is supplied a constant gate current (herein termed a "hard" drive) sufficient to maintain the SCR 18 in a ready-to-conduct mode. The battery strings 14 are thus connected to the system load bus 12 for all conditions when the primary DC source 8 is unable to supply the system load current. Float charging at a constant current prevents thermally damaging any of the battery cells through thermal runaway or meltdown, as explained above.

A second power converter PS2, of conventional construction, is connectable in series with the battery strings 14 in a reverse polarity condition to discharge the battery strings 14 into the load 10 for the purpose of testing the performance and condition of the battery strings, as will be explained in detail hereinafter.

A battery management controller 26 performs monitoring and controlling functions in the battery management system of FIG. 1. The controller 26 monitors the voltage of each battery string (see leads 28 and 31 in FIG. 1), the battery cell/monoblock voltage or battery-string midpoint voltage (leads 29 and 33), the battery-string current (lead 30 and current monitor shunt 32), system load current (lead 34 and load current shunt 35), and battery internal temperature and resistance (leads 29 and 33), as well as the system load bus voltage (lead 44).

The controller controls the discharge contactor set K1 (lead 36, relay 4 and switch 5), the SCR 18 (lead 38), the float/boost power converter PS1 (lead 40), and the discharge test power converter PS2 (lead 42).

The operation of the system illustrated in FIG. 1 will now be described.

The battery management system of FIG. 1 provides a means to control the factors which influence the life of a VRLA battery or batteries of other types. The control and management of the way a battery is charged, with particular attention to the float, boost and temperature compensation methods of charging batteries, will help maximize their useful life. Further, the battery management system of FIG. 1 provides means to test a string or strings of batteries while monitoring cell voltages, thus obtaining accurate information with regard to both their health and state of readiness (capacity). Also, the battery management system is designed so that any failure mode affecting the ability of the system load bus 12 to sustain the system load 10 will immediately return the power system to a standard rectifier/battery/load configuration.

During normal operation the primary DC source 8 supplies all load current via the system load bus 12 to the system load 10. The VRLA battery strings 14 are connected to the system load bus 12, but its voltage is displaced/blocked by the forward voltage drop of the SCR 18. The SCR 18 provides an approximate 1.5 volt differential, thus effectively removing the battery strings 14 from the influence of the primary DC source voltage 8.

During float charge operation, the predominate mode of operation for back-up batteries, the power converter PS1 provides a predetermined substantially constant maintenance or float current to float charge the battery strings 14. The amount of the current is dependent upon the type, size, and age of the battery. Also, as noted, the float charging current is substantially constant at a given time and for a given condition of the battery cells/monoblocks, but may differ at different times and battery conditions. SCR 18 is provided a constant gate signal to maintain the SCR 18 in a ready-to-conduct mode to connect the battery strings 14 to the system load bus 12 for all conditions when the primary DC source 8 is unable to supply the system load current.

While maintaining the battery strings 14 on float charge, on a command signal from the battery management systems controller 26, PS1 increases its constant current output to a higher boost amount. Like the float charging current, the boost charging current is constant at a given time and for a given condition of the battery cells/monoblocks, but may differ at different times and battery conditions, and will differ depending upon size of the battery. In practice, the substantially constant charging current, float and boost, delivered to the battery strings is determined by individually testing, at the direction and under the control of the controller 26, the battery cells/monoblocks. The controller determines for a given application of charging current, or a given period of time, an optimum level of current which will cause the battery cells/monoblocks to deliver optimum performance over a maximum predicted life. The testing of the battery cells/monoblocks may include impressing on the individual cells/monoblocks a battery manufacturer specified fixed voltage to determine the current demand of the individual cells/monoblocks. The converter pS1 has a current limiter to limit the current supplied to the individual cells/monoblocks during this test.

During boost charge the increased current begins to overcharge the battery strings 14. This overcharging causes the battery string's voltage to increase. If the battery string voltage approaches the level at which the SCR 18 conducts, a voltage detector circuit which monitors the battery string voltage removes the gate signal supplied to the SCR gate 48. The voltage detector circuit for convenience may be considered to be part of the controller shown schematically at 26.

The frequency of occurrence of the command signal from the controller 26 that initiates the boost charge is determined by battery measurements taken periodically (every 24 hours, for example) while on float charge. The end of the boost charge occurs when the voltage of the battery strings 14, monitored by the controller 26, reaches a peak and levels off. During this period, battery cell or monoblock voltages (or battery string midpoints as a minimum) are monitored by the battery management system controller 26 to ensure that the cells 16 are properly accepting the higher charge current.

The boost charge, which occurs when needed (as determined by battery parameter measurements), ensures that both the positive and negative electrodes of the battery string cells 16 are polarized. Boost charging ensures that the cells 16 are fully charged and can recombine the gases involved. This will minimize cell "dry out" (water loss), and add to the useful life of the VRLA and other types of battery cells.

Whenever the primary DC source 8 is unable to supply the total load current, the system load bus voltage begins to decay. The SCR 18 is receiving a hard gate signal at this time and immediately begins to conduct, placing the batteries onto the system load bus 12. A voltage detector located in each battery string module 15 constantly monitors the system load bus voltage, senses a decay in that voltage and commands contactor set K1 to release, thus connecting the battery strings 14 directly to the system load bus 12. The voltage detector circuit for convenience may be considered to be part of the controller 26. The SCR 18, now shorted by contactor set K1, ceases to conduct but remains available. The closure of the contacts of the contactor set K1 takes place less than 10–15 milliseconds after the detection of the decay of the system load bus voltage. The transition of battery power to the system load bus 12 is smooth and without interruption.

Throughout all battery discharges, including emergency discharges and test discharges (to be described), the battery management system controller 26 is constantly monitoring the battery string voltage(s) to determine the remaining reserve capacity. Individual cell voltages or monoblock voltages (or battery string midpoint voltages as a minimum) are also monitored and the data is stored for later use in determining the health and reserve capacity of the battery strings 14.

After the primary DC source 8 returns to operation, it again supplies all load current via the system load bus 12 to the system load 10. Contactor set K1 remains released (closed), allowing the primary DC source constant voltage output to charge the battery strings 14. Contactor set K1 does not operate (open) until the battery string charge current, as detected by the controller 26, falls below a predetermined level. At that time the gate signal to the SCR 18 is removed, contactor set K1 operates (opens), and the battery strings 14 receive the remaining boost charge from converter PS1. Once properly charged the battery strings 14 return to the float charge mode.

During float charge operation and stable conditions, individual battery string discharge tests can be programmed to start. Such tests are typically needed only 2 or 3 times per year and the controller 26 can be programmed to perform the tests automatically. These tests can also be performed manually with local input, or manually with remote input. During any mode of testing, the controller 26 provides a signal when the test is to begin.

When the controller 26 determines that it is time for a particular battery string 14 to be subjected to a battery discharge test (each battery string individually), it commands the contactor set K2 to operate. Contactor set K2 preferably comprises a relay 6 actuating a set of switch contacts 7.

This operation transfers the battery string 14 from the float/boost power converter PS1 output to the test discharge bus 50. The controller 26 signals the test discharge power converter pS2, located between the test discharge bus 50 and the system load bus 12, to increase its output voltage until the combined voltage of the battery string 14 and converter PS2 slightly exceeds the system load bus voltage. At this time the battery string 14 begins to provide load current. The test power converter PS2 regulates the combined output voltage to maintain a battery test discharge current equal to the battery's rated 8 hour discharge rate (which depends upon size of the battery). Throughout this test the system load bus voltage will not increase by more than a few millivolts.

During the battery discharge test, the battery string voltage is monitored to determine the remaining reserve capacity of the batteries. A discharge of short duration is sufficient to determine reserve capacity. The test duration is dependent upon the size of the battery and its reserve time design objective. When the controllers' algorithm determines that the controller has sufficient and consistent information to predict string capacity, the test is terminated. In applications with two or more battery strings, each string is tested separately, and then only after the previously tested string has completed its recharge and has been returned to its float charge mode.

Many remote applications have battery strings comprised of multiple "monoblock" batteries (typically a 6 or 12 volt group of cells). Each replaceable "monoblock" is monitored during all modes to allow the identification of weaker "monoblocks" within a battery string.

A "hard" gate drive signal is supplied to the gate 48 of the SCR 18 at all times except when a voltage detector circuit (comprising part of the controller 26) senses that the battery string voltage is greater than a predetermined voltage threshold—herein termed "Threshold #1." At this time the voltage detector circuit will disable the gate drive signal to prevent the SCR 18 from conducting. This condition usually occurs during the boost charge mode of operation. A second voltage detector circuit (also part of the controller 26) monitors the system load bus 12 and restores the gate drive signal for the SCR 18 if the bus voltage falls below a second predetermined voltage threshold, herein termed "Threshold #2 ."

The shunting contactor set K1 is in parallel with the SCR 18 and connects the battery strings 14 to the system load bus 12 whenever the system load bus voltage falls below Threshold #2. The contactor set K1 has break-type (normally closed) contacts, thus connecting the battery strings 14 to the system load bus 12 if the contactor set K1 or its control fails. The contactor set K1 is operated (open) during float, boost, or test discharge modes.

Following a battery discharge, due to the load bus voltage being less than Threshold #2 (assuming the primary DC source is still inoperable or not keeping the load bus voltage at the desired magnitude), the contactor remains un-operated (closed), keeping the battery strings 14 attached to the system load bus 12. Once the recharge current to the battery strings has dropped below the boost charge current ($>I_{Boost}$) setpoint, the contactor set K1 will be operated (opened) and return the SCR 18 to its blocking function. The boost charge circuit will now finish recharging the battery strings 14.

The actions of the controller 26 identified above in connection with FIG. 1 will now be described in more detail. Individually, for each item monitored, the control action of the controller will be described.

System load bus voltage The controller 26 monitors the system load bus voltage continuously and uses the data derived during emergency discharges to calculate remaining capacity during an emergency discharge.

Battery string voltage (all strings) The controller 26 monitors the battery string voltage during the test discharge and uses the data derived to calculate the predicted capacity of the battery strings. It also uses this information to help determine the battery string health.

Battery cell monoblock voltages or battery string midpoints The controller 26 monitors these data continuously and uses the information to help determine battery cell/monoblock health.

Battery string current (each string) The controller monitors this information during battery recharge to determine when the contactor set K1 (relay) should be energized (opened). The power converter pS1 is then used to finish charging the battery string.

System load current The system load current is monitored continuously by the controller 26. These data are used during an emergency discharge to calculate the remaining capacity of the system.

Temperature (near batteries) The ambient temperature in the near vicinity of the batteries is measured continuously and the information used to help calculate what temperature compensation might be needed to adjust a battery string or strings float current charge (i.e., to increase or decrease the float current).

Contactor set K1 The K1 contactor is a normally closed contactor. During the float/boost mode and the test discharge mode, contactor set K1 is energized (open), thus removing its direct connection across the SCR 18. When de-energized (closed), it shunts the SCR 18. The controller 26 can program contactor set K1 either ON (open) or OFF (closed).

SCR 18 The function of the SCR 18 is to provide a voltage block of the system load bus voltage from the battery strings 14. However, it still provides a passive connection for the battery strings 14 to the system load bus 12. Responsive to the controller 26, this is accomplished by the SCR's control gate 48 being supplied a constant hard drive signal current.

Contactor set K2 The contactor set K2 is a normally closed contactor. In this state it connects the power converter PS1 to the negative terminal of the battery strings 14. When the controller 26 determines that there is a need for a battery string discharge test, the controller energizes contactor set K2. This connects the negative terminal of the battery strings 14 to the test discharge bus 50. The contactor set K2 is maintained in an energized state until either the discharge test is completed or the system load bus voltage falls below the Threshold #2 setting. In that event, both contactor set K1 and contactor set K2 are de-energized (closed).

Float/boost power converter PS1 Converter PS1 supplies both the float and boost substantially constant current charges to the battery strings 14. The mode of operation, float charge (a lower value of substantially constant current) or boost charge (a higher value), and the particular level of current selected, is always determined by the controller 26.

Discharge test power converter PS2 After the controller 26 has initiated a battery string discharge test by energizing contactor set K2, it sends a signal to turn on converter PS2. It also signals converter PS2 as to what discharge current level it is to maintain. The converter PS2 then proceeds to add its voltage to that of the open circuit voltage of the battery strings 14 connected to the test discharge bus 50 and automatically maintains the voltage level needed to discharge the programmed current level into the system load bus 12. When the test is ended the converter PS2 is turned off.

One possible implementation of the system illustrated in FIG. 1 constructed for use in a telephone switching plant, has the following specifications.

Nominal primary DC source −54 VDC
Nominal battery string voltage (float) −54 VDC
Battery string voltage (open circuit) −48 to −49 VDC
Number of battery strings 4
Battery string charging current (constant float) 10–120 mA
Battery string charging current (constant boost) 100–1200 mA
Test discharge current 0–10 Amp
Voltage threshold #1 −55 VDC
Voltage threshold #2 −53 VDC
Rating of SCR 18 50 Amp
Normal SCR gate drive current 1–10 mA Those skilled in the art will appreciate that, whereas the controller 26 has been described as being remote from the power management system, to protect the power supply system from a failure in the controller a number of the monitoring and control functions, e.g., control of the contactor set K1, the power converter pSI, and the SCR 18 to name just three control functions, may be incorporated in a local controller (preferably located in the battery string module 15) forming part of the battery management system.

Whereas the system of FIG. 1 has been described in a VRLA battery application, the principles of the system may be employed with flooded lead acid batteries, Ni—Cad batteries, and rechargeable batteries of other types.

Figure 2:
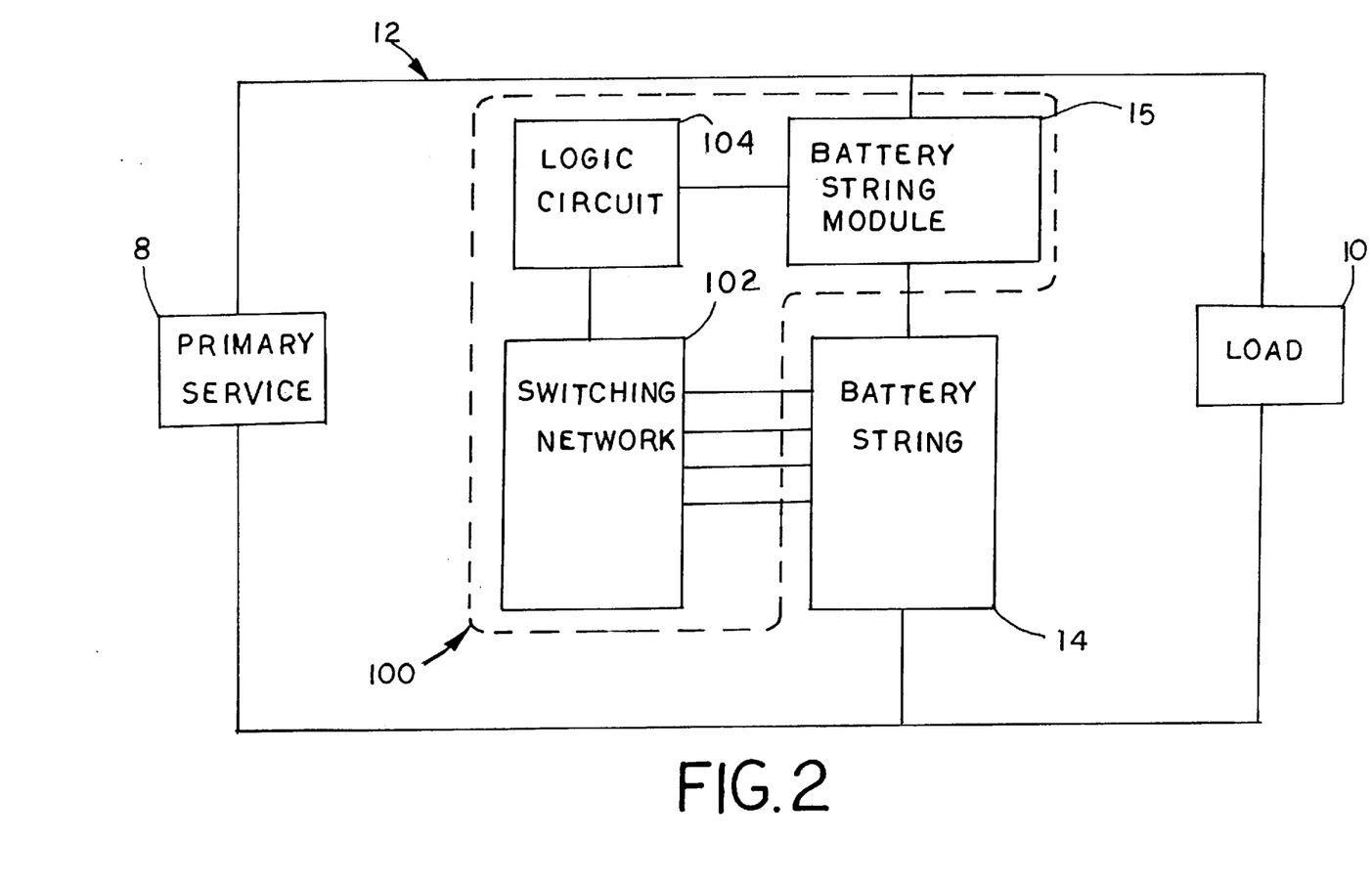
FIG. 2 is a schematic diagram of a back-up battery management apparatus constructed in accordance with the teachings of the present invention.

An apparatus 100 for testing individual battery cells in a string of battery cells constructed in accordance with the teachings of the present invention is shown generally in FIG. 2. As illustrated in FIG. 2, the present invention combines the benefits of the battery string module 15 described above in connection with the circuit of FIG. 1 with a switching network 102 and logic circuit 104 to provide an apparatus capable of testing and charging individual cells or individual groups of cells of a battery string 14 without physically removing either the string 14 or any of its cells from the load bus 12. As a result, the present invention enables testing and charging of individual cells or groups of cells without loss of back-up capability.

As with the system of FIG. 1, the apparatus shown in FIG. 2 and the following more detailed embodiments have certain components in common such as the battery string module 15, primary source 8, load 10, and load bus 12. In the interests of brevity and clarity, these common structures will not be re-described here. Rather, the interested reader is referred back to the description of FIG. 1 for further details on possible implementations of these components. To facilitate this task, whenever possible, like numbers will be utilized to designate corresponding structures in the figures.

As explained in connection with the description of FIG. 1, the battery string module 15 includes an isolation circuit which at least partially isolates the string of battery cells 14 from the load bus 12 while permitting current flow between the battery cells and the load bus 12 in the event of a failure of the primary source 8. The battery string module 15 also serves other functions. It provides a float charge current to the battery string 14 to ensure the string 14 maintains a charge at or near full capacity. It also provides periodic boost charge current to the string 14 when it is detected that the charge of the string 14 or a part of the string has fallen below a predetermined threshold. The boost charge current is higher than the float charge current. Both currents are preferably output by the battery string module 15 at substantially constant levels dependent upon the type, state of health, and charge of the batteries in the string 14.

In accordance with an important aspect of the invention, a switching network to selectively form circuits for discharging one or more of the battery cells is provided. The switching network 102 preferably includes at least two controlled switches and a plurality of leads connected to the battery cells. By adjusting the state of the controlled switches, one or more of the battery cells can be selectively discharged for testing, and subsequently re-charged without substantially effecting the state of charge of the remaining cells in the string 14. In accordance with another aspect of the invention, the switching network 102 can be implemented to apportion the float current and/or boost current generated by the battery module 15 between the cells or groups of cells in the string 14 to match the charging current to the individualized charging needs of the cells or groups of cells in the string 15.

In order to control the operation of the switching network 102, the apparatus 100 is provided with a logic circuit 104.

The logic circuit 104 is preferably coupled to the controlled switches of the switching network 102 for selecting which of the battery cells in the string 14 will be discharged for testing. In particular, the logic circuit 104 is preferably adapted to adjust the state of one or more of the controlled switches to form a discharge path whereby one or more predetermined cells are discharged to test the health thereof. In some preferred embodiments, the logic circuit 104 is adapted to adjust the state of one or more of the controlled switches to apportion the charging current (float, boost or otherwise) delivered by the battery string module 15 among the cells of the string 14 in an efficient manner.

As shown in FIG. 2, the logic circuit 104 is also preferably coupled to the battery string module 15 to control the operation thereof (e.g., selecting float charging, selecting boost charging current, etc.) as explained in connection with the system of FIG. 1. Although for simplicity of illustration they have not been explicitly illustrated in FIG. 2, the logic circuit 104 is also preferably provided with a sensing network to provide feedback concerning the health and capacity of the cells of the battery string 14. Other feedback connections can also be provided as discussed above in connection with the description of FIG. 1.

Figure 3:
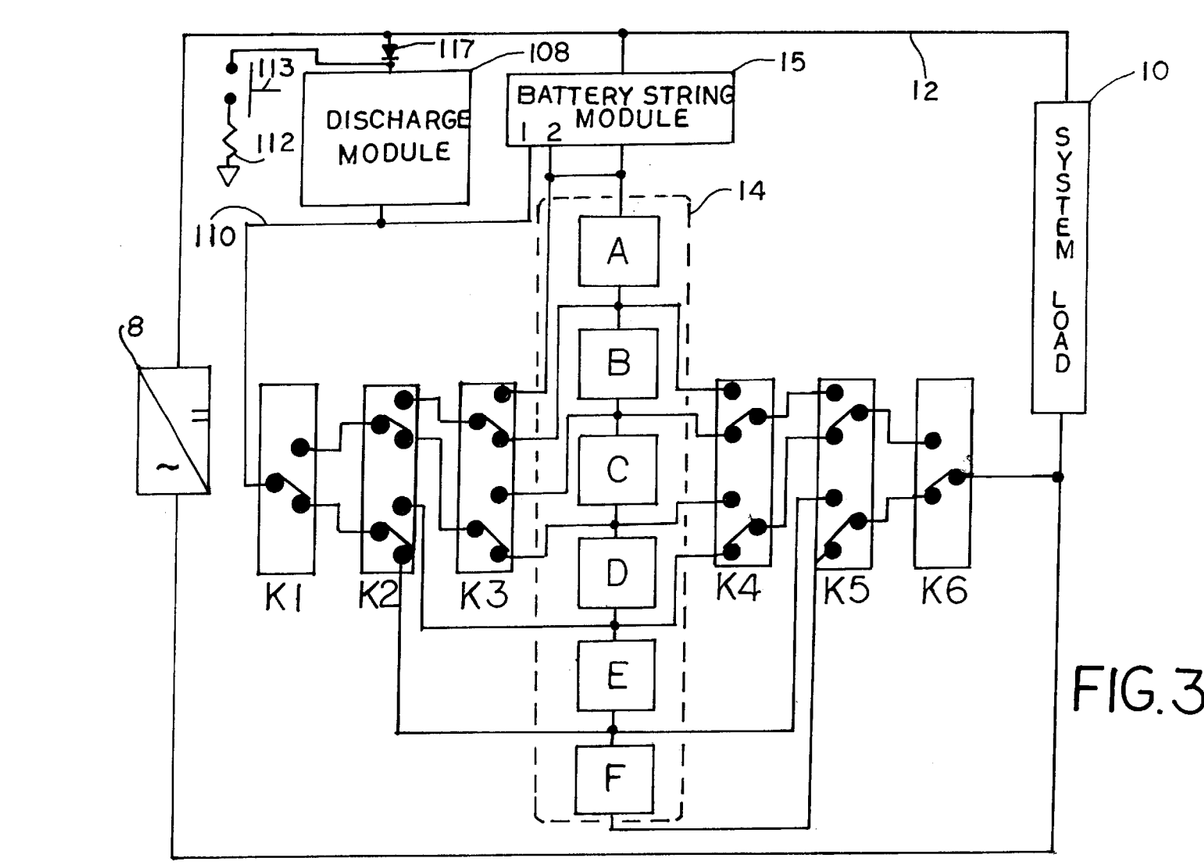
FIG. 3 is a schematic diagram illustrating one preferred embodiment of the inventive back-up battery management apparatus.

A more detailed illustration of an apparatus constructed in accordance with the teachings of the invention is shown in FIG. 3. For simplicity of illustration, the logic circuit 104, which can be implemented as a microprocessor, is not included in the illustration. Those skilled in the art will, however, readily appreciate that the logic circuit 104 is preferably coupled to the battery string module 15, to the controlled switches of the switching network, and to the discharge module discussed below for sensing and controlling the operation of those devices in a conventional manner.

As shown in FIG. 3, in the instant embodiment a battery string 14 comprised of battery cells A, B, C, D, E, F (which may or may not comprise more than one cell each) is coupled in series with the battery string module 15 and connected across a primary power supply 8. As discussed above, the battery string module 15 substantially isolates the battery string 14 from the load bus 12 except in instances where the primary power source fails.

For the purpose of affecting a discharge path for testing predetermined cells or groups of cells in the battery string 14, the apparatus is provided with a discharge module 108. The discharge module 108 is preferably implemented like converter PS2 of the system illustrated in FIG. 1. It is responsive to a control signal from the logic circuit to form a connection between one pole of the load bus 12 and an input lead 110 to the switching network and to supplement the open circuit voltage of a connected cell to be tested to discharge that cell into the load bus 12. preferably, the discharge module 108 is coupled to the load bus 12 via a diode 117 for circuit protection and rectification.

In order to selectively discharge one or more of the batteries in the string 14, a switching network in the form of a plurality of cascaded control switches K1, K2, K3, K4, K5, K6 is provided. As shown in FIG. 3, the controlled switches K1–K6 may be implemented as single pole switches, double pole switches or as other conventional switches without departing from the scope of the invention. In the preferred embodiment, switches K1–K6 are implemented as relays. In any event, the switching network is further provided with a plurality of connecting paths connected between the terminals of the battery cells in the string 14 and the controlled switches K1–K6. Depending on the level of control desired, the network can be implemented with leads connected to every cell in the string 14 or with leads connected to predetermined groups of cells.

As shown in FIG. 3, by adjusting the state of the controlled switches K1–K6, a discharge path can be formed connecting any of the battery cells A–F across the load 10 via the discharge module 108. For example, if the switches K1–K6 are left in their default position, the battery string module 15 is deactivated, and the discharge module 108 is activated, a discharge path will be formed comprising: the discharge module 108, switches K1 and K2, battery cell F, switches K5 and K6 and the load 10. This discharge path will enable the discharge of cell F (which may actually be a group of battery cells) without effecting the charge of the remaining cells (A–E) in the string 14 in any substantial manner. In this way, cell F can be tested without removing the string 14 or any of its cells (A–F) from the load bus 12.

Once the test is complete, discharge module 108 is deactivated by the logic circuit and the battery string module 15 is activated to provide its full charge current via output terminal 1 to recharge the tested battery (in the above example, cell F). If desired, the tested battery can be recharged until a predetermined threshold is reached, after all the cells are tested boost charging will be activated to complete the recharging process of the string as described in connection with the system of FIG. 1.

Figure 4:
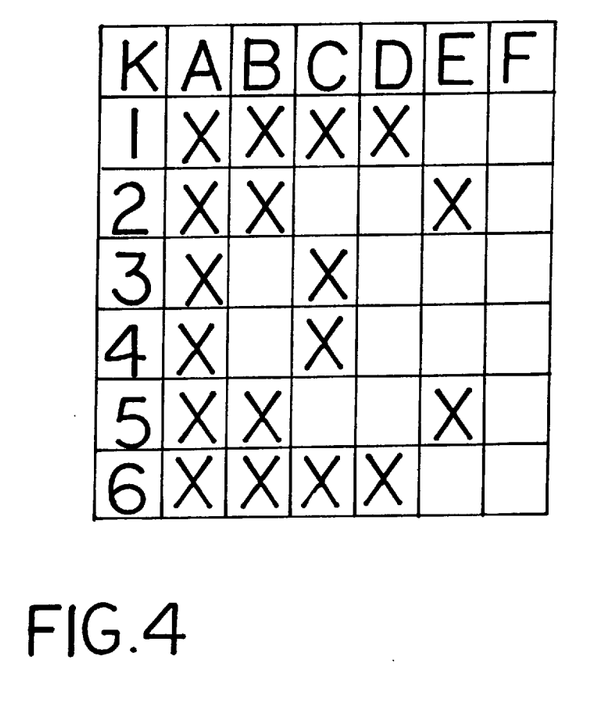
FIG. 4 is a state table illustrating certain operating states of the controlled switches of the device of FIG. 3.

A state chart illustrating the states of the switches K1–K6 required to individually discharge specified cells A–F of the string 14 is shown in FIG. 4. By way of example, in order to individually discharge cell D, switches K1 and K6 must be thrown. Changing the states of switches K1 and K6 in this manner will form a discharge path comprising: discharge module 108, switches K1, K2 and K3, cell D, switches K4, K5 and K6 and load 10.

Those skilled in the art will appreciate that the switching network can be utilized to discharge more than one cell, if desired. For example, by throwing switches K1, K3 and K6, the logic circuit can discharge cells C and D simultaneously without departing from the scope of the invention. Those skilled in the art will further appreciate that, during discharge testing of one or more of the cells A–F, the float/boost charging current output of the battery string module 15 should be disabled. In other words, the battery string 14 is at open circuit voltage. This prevents the discharging battery cell from being presented with a charging current during the discharge test.

For the purpose of ensuring the presence of a load adequate to discharge the cell selected for testing, the apparatus can be optionally provided with a test load 112. As shown in FIG. 3, the test load 112, (in this instance a resistive impedance), is preferably coupled to the discharge module 108 via a controlled switch 113. The logic circuit 104 is preferably coupled to controlled switch 113 to connect the test load 112 into the discharge path formed by the discharge module 108 and the switching network at appropriate times.

The apparatus illustrated in FIG. 3 can be utilized with any desired rechargeable battery type without departing from the scope of the invention. In two preferred embodiments, VRLA batteries and Ni–Cad batteries are respectively used. In the case of Ni–Cad batteries, it is preferable to pair the cells for testing purposes. Since Ni–Cad batteries are nearly fully discharged during testing, it is often desirable to add two additional batteries to a given string 14 in order to ensure sufficient back-up capacity at all times, even when one pair of cells is nearly fully discharged in a test. Since VRLA batteries do not require full discharge for proper testing, no additional VRLA batteries need be added to the string 14 in those embodiments employing such batteries.

Embodiments employing VRLA batteries have different worse case scenarios than those employing Ni–Cad batteries. For example, in the case of a VRLA battery string 14, the cell or cells being discharged at the time of an emergency (e.g., a failure of the primary source 8) would at worst have been discharged for about two hours (the maximum length of time required to perform most discharge test techniques on VRLA batteries). Thus, the tested cells would only act as a weakened cell or cells in the string 14. These weakened cells would limit the expected discharge rate of the string 14 by the percentage of discharge completed under the test at the time of the emergency divided by the number of cells (or groups of cells) in the string 14.

In the case of Ni–Cad batteries, which must be nearly fully discharged in order to determine their state of health, the cell (or cells) under test will, in the worst case, have been discharged to a level of 0.9 volts per cell (or its equivalent for a group of cells) at the time of the emergency. Thus, when the string 14 is pressed into service, the tested cells will be driven towards 0 volts per cell (or its equivalent). Ni–Cad cells are not, however, adversely effected by such a discharge event.

Those skilled in the art will appreciate that, in order to ensure the battery string 14 is on line in the event of a failure of the primary power supply 8, the logic circuit should be adapted to sense voltage drops on the load bus 12 and, when such an event is detected, to automatically terminate any discharge test currently underway. In the embodiment illustrated in FIG. 3, such termination will preferably cause all of the controlled switches K1–K6 to return to their default positions (shown in FIG. 3). This ensures that the battery string 14 is properly connected across load 10 via switches K5 and K6 and the battery string module 15.

Figure 5:
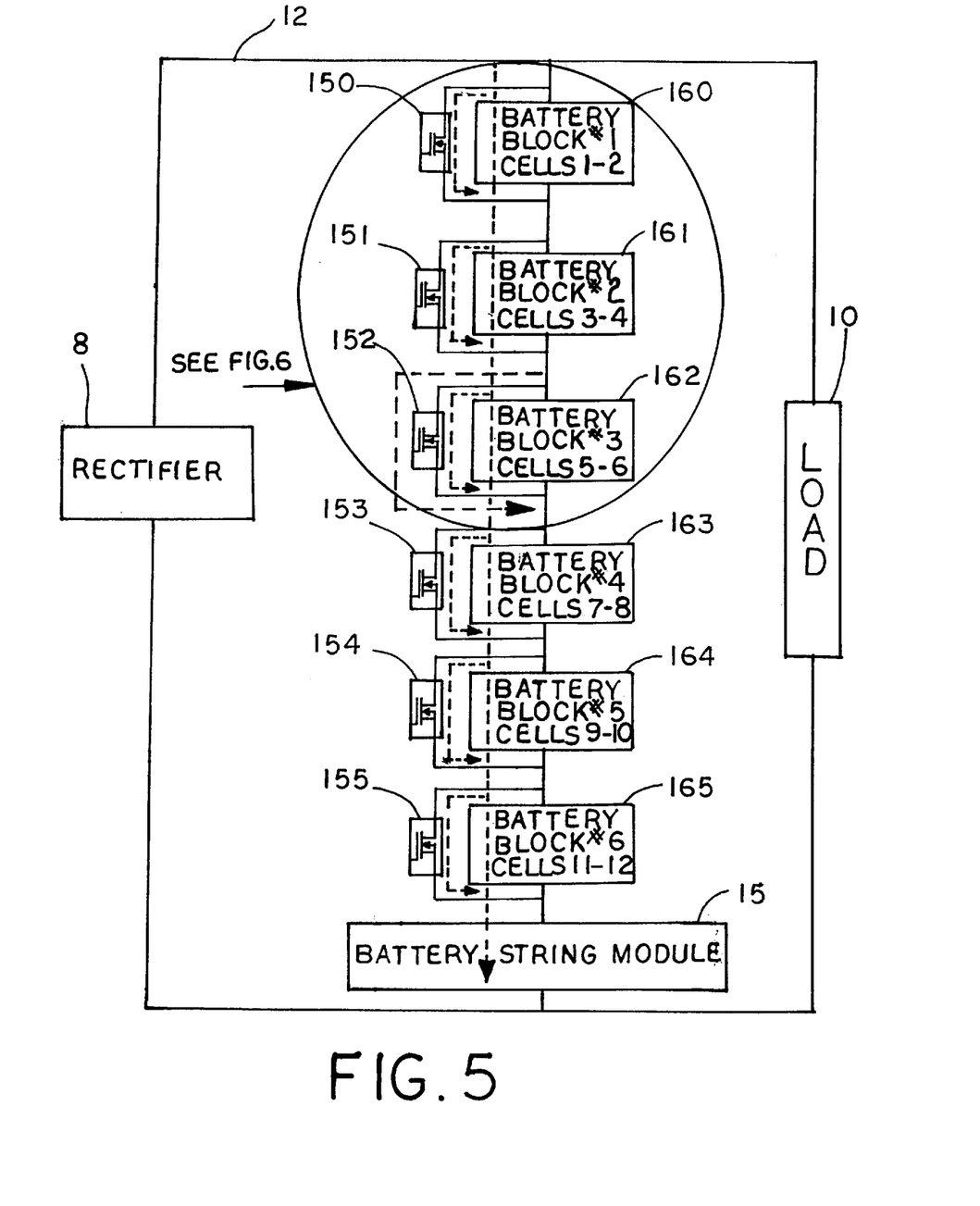
FIG. 5 is a schematic diagram illustrating another preferred embodiment of the inventive back-up battery management apparatus.
Figure 6:
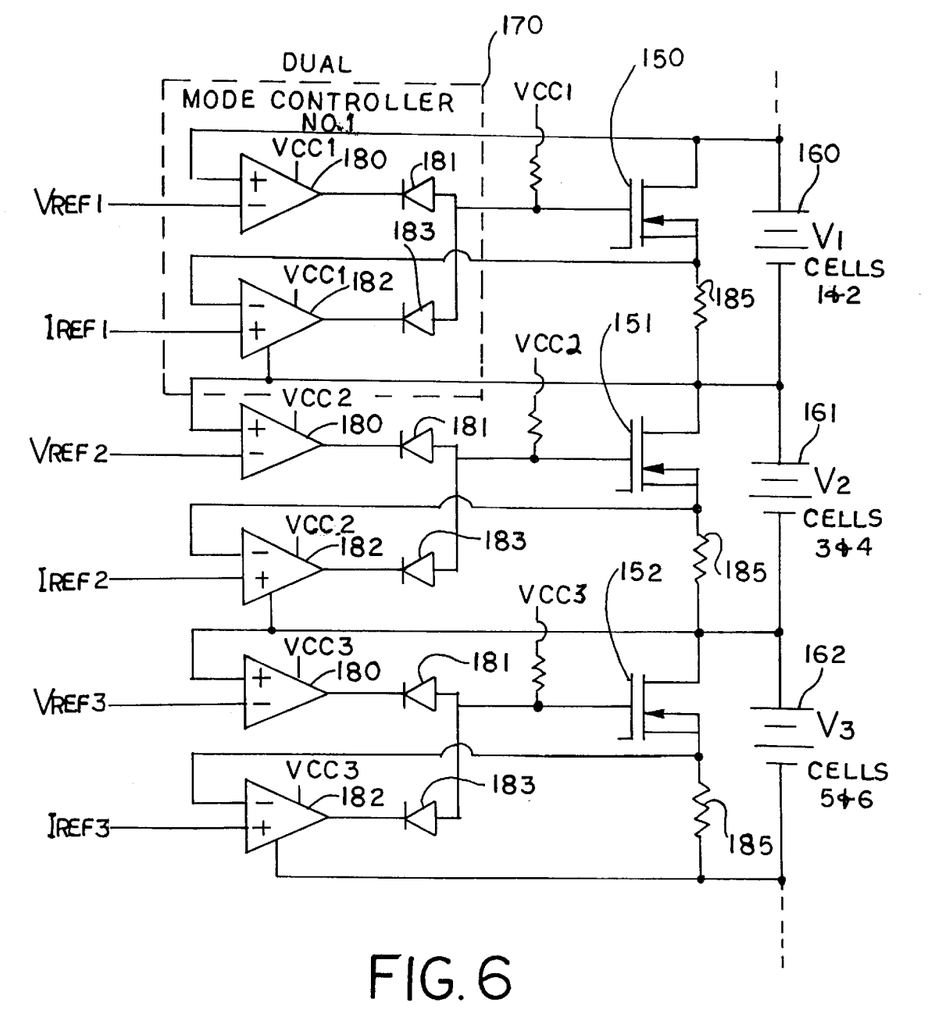
FIG. 6 is a schematic diagram illustrating part of the logic circuit associated with the device of FIG. 5.

An alternative apparatus constructed in accordance with the teachings of the invention is illustrated in FIGS. 5 and 6. As with the apparatus disclosed above, the apparatus of FIG. 5 includes a battery string module 15 connected in series with a battery string, both of which are coupled across a load 10 supplied by a power supply 8 via a load bus 12. In this embodiment, however, the switching network comprises a plurality of controlled switches 150, 151, 152, 153, 154, 155 connected as shunts across predetermined groups of the battery cells 160, 161, 162, 163, 164, 165. As explained further below, the states of the controlled switches 150–155 can be controlled to selectively discharge the battery cell groups 160–165 as well as to distribute the charging current delivered to the cell groups 160–165 by the battery string module 15 according to the charging needs of the individual groups 160–165.

For the purpose of controlling current flow through the battery cell groups, the apparatus is provided with a logic circuit coupled to the controlled switches 150–155. The logic circuit is preferably implemented to selectively and individually control the conducting states of each of the controlled switches 150–155 in order to control both discharging and charging of the battery cell groups 160–165 on a cell group-by-cell group basis.

Turning first to the discharge mode, the controlled switches 150–155 of the embodiment illustrated in FIG. 5 are preferably implemented as field effect transistors (FETs). The FETs are preferably connected as shunts across associated battery cell groups 160–165 as shown in FIG. 5 such that, upon receipt of a suitable drive signal from the logic circuit, they will effectively short their associated battery cell group 160–165 to perform a discharge test. Those skilled in the art will appreciate that although more than one of the cell groups 160–165 can be discharged at any given time without departing from the scope of the invention, in order to optimize the back-up capability of the battery string, it is preferable to discharge (and subsequently re-charge) one group 160–165 at a time. In other words, it is preferable to discharge a battery cell group such as group 163 and re-charge that same group (163) before testing a second group such as group 160. As with the embodiments illustrated above in connection with FIGS. 2–4, the logic circuit 104 can be programmed to test the entire string of battery cells by automatically discharging and recharging each of the cells in turn.

As mentioned above, the battery string module 15 is adapted to provide the battery string with charging current in the form of float current and boost current. As those skilled in the art will appreciate, the float current delivered to the battery string by the battery string module 15 is, in large part, determined by the battery cell group 160–165 with the highest impedance. Specifically, in order to ensure each cell group 160–165 is being charged appropriately, it is necessary to supply enough current to charge the most resistant cell group sufficiently. Typically, cell groups 160–165 will have somewhat different impedances. In prior apparatus, these physical facts would necessarily mean that more current than is needed is supplied to the groups of cells with lower impedance.

In accordance with one important aspect of the invention, the disclosed apparatus overcomes this problem by controlling the conducting states of the controlled switches 150–155 to shunt the unneeded portion(s) of the charging current from the battery cell groups with lower impedance to ground. In other words, the disclosed apparatus regulates the charging current delivered to each group of cells 160–165 to ensure each cell group receives the level of charging current it needs. By way of example, if cell groups 160 and 164 need 1 amp of float charging current, cell groups 161, 162, and 165 need 0.9 amps of float charging current, and cell group 163 needs 1.1 amps of float charging current, the logic circuit would adjust the states of controlled switches 150 and 154 to shunt 0.1 amps of current to ground from their associated battery groups 160, 164; the states of controlled switches 151, 152 and 155 to shunt 0.2 amps of current to ground from their associated groups 161, 162 and 165; and place controlled switch 154 in a non-conducting state such that cell group 164 receives a full 1.1 amps of charging current.

In the instance where one or more cells requires a boost charge, the logic circuit would control the states of the controlled switches 150–155 to ensure the depleted cell groups receive their required boost charge while shunting all but a float charging current to ground from those groups not requiring the boost charge. This ability can also be employed to re-charge a discharged cell group after testing. In such an instance, the operating states of the FETs of the non-tested groups are adjusted to shunt most of the re-charge current (except, in the typical instance, a float charge current) to ground from their respective cell groups. The FET associated with the discharged group of cells will typically be switched to its nonconducting state such that the discharge cell group receives full charging current.

Those skilled in the art will readily appreciate that the individualized charging and discharging control over the individual battery cell groups 160–165 afforded by the instant invention can be utilized in many combinations to optimize the operation and life of the battery string 14 without departing from the scope or spirit of the invention. By way of example, the individualized control can be supplemented by a temperature compensation mode wherein the charging current is incremented or decremented based on temperature changes in the cell groups 160–165. Such temperature control could be employed in connection with any or all of the float charge, boost charge, re-charge, or discharge modes, without departing from the scope of the invention. Such temperature compensation adjustments could, for example, be based upon one degree centigrade changes wherein a one degree temperature change would result in a predetermined incremental change in the charging current delivered by the battery string module 15 and/or shunted by the controlled switches 160–165.

Those skilled in the art will readily appreciate that the logic circuit can be implemented in numerous manners without departing from the scope or spirit of the invention. For example, the logic circuit could be implemented in a conventional manner as a suitably programmed microprocessor with appropriate conventional sensor and feedback circuitry to monitor the battery cell groups 160–165 and regulate the operation of the controlled switches 150–155.

In one preferred embodiment, the logic circuit is implemented as a plurality of dual mode controllers 170. As shown in FIG. 6, each such dual mode controller 170 is preferably associated with one of the controlled switches 150–155 to provide a controlled gate current thereto. In the preferred embodiment, each of the controllers is implemented by a pair of comparators 180, 182 with associated blocking diodes 181, 183. A first one of the comparators 180 is provided with a voltage reference (Vref 1) to set the charging current of the associated battery group 160 and a second one of the comparators 181 is provided with a voltage reference (Iref 1) to place a current limit on the amount of current shunted from the associated cell group 160. To monitor the shunted current, current sense resistors 185 are provides as shown in FIG. 6.

By individually adjusting the reference voltages (Iref and Vref) for each dual mode controller 170, the logic circuit can individually control the amount of charging current delivered to each cell group 160–165 or effect the discharge of one or more battery cell groups 160–165 as explained above. To this end, those skilled in the art will readily appreciate that the logic circuit preferably includes a microprocessor adapted to set and vary the voltage reference values (Iref and Vref) in accordance with the desired operation of the battery string 14. Those skilled in the art will further appreciate that such a microprocessor would preferably interact with the battery string module 15 to control the amount of current delivered to the string, as well as with the dual mode controllers 170 to regulate the manner in which the delivered current is apportioned among the battery cell groups 160–165.

Those skilled in the art will further appreciate that, for proper operation of the dual mode controllers 170, the positive voltage reference (Vref) of each controller 170 must not only be individualized to the battery group in question, but it must also conform to the polarity of the controlled battery cell group. Furthermore, the current reference voltage (Iref) of each controller 170 must also be individualized to its respective controlled cell group, and must also conform to the polarity of the controlled cell group. Finally, for each controller 170, each source reference voltage (CC) must be individualized, must be of a higher value than the Vref value of the controller 170, and must conform to the polarity of the controlled cell group.

Those skilled in the art will further appreciate that, the above embodiments have been described in the context of controlling battery cells or a group of cells to emphasize that the invention can be implemented to regulate a battery string on a cell-by-cell basis or in terms of groups of cells. Those skilled in the art will also appreciate that the present invention can be used with any different type of rechargeable battery including, without limitation, Ni–Cad and VRLA batteries, without departing from the scope or spirit of the invention.

Finally, it will be appreciated that, although for ease of explanation, the invention has been described in connection with certain embodiments, there is no intention to limit the invention thereto. Rather, it is intended to cover all embodiments and equivalents thereto falling fairly within the scope of the invention as defined in the appended claims.

What is claimed is:

1. An apparatus for selectively testing battery cells in a string of battery cells hard wired one cell to another and employed as a back-up power supply to a primary power source, the string of battery cells being connected to a load bus associated with the primary power source for delivering power in the event of a failure of the primary power source, the apparatus comprising:

an isolation circuit for at least partially isolating the string of battery cells from the load bus while permitting current flow between the battery cells and the load bus in the event of a failure of the primary power supply;

a switching network associated with the battery cells and including at least two controlled switches arranged to selectively form circuits for discharging one or more of the battery cells while the cells remain connected in the string; and, a logic circuit connected to the controlled switches for selecting which of the battery cells will be discharged for testing.

2. An apparatus as defined in claim 1 wherein the string of battery cells remains connected to the load bus during testing for delivering power in the event of failure of the primary power source, and the battery cell selected by the logic circuit for testing remains connected in the string of battery cells when it is discharged.

3. An apparatus as defined in claim 1 wherein the switching network enables recharging of the battery cell selected by the logic circuit when the testing is completed, and while the battery cell remains connected in the string.

4. An apparatus as defined in claim 1 wherein the logic circuit tests the entire string of battery cells by automatically discharging and recharging each of the battery cells in the string in turn.

5. An apparatus as defined in claim 4 wherein the logic circuit recharges a first tested battery cell before initiating discharge of a second battery cell in the string.

6. An apparatus as defined in claim 5 wherein only one of the battery cells in the string of battery cells is discharged for testing at any given time.

7. An apparatus as defined in claim 1 wherein the isolation circuit comprises a battery string module.

8. An apparatus as defined in claim 7 wherein the battery string module selectively provides a float current to the string of battery cells.

9. An apparatus as defined in claim 8 wherein the float current delivered to each of the battery cells in the string is regulated by the logic circuit via the switching network.

10. An apparatus as defined in claim 9 wherein the switching network shunts at least a portion of the float current to ground from at least one of the battery cells in the string.

11. An apparatus as defined in claim 9 wherein the regulation of the float current delivered to each of the battery cells is at least partially based on temperature.

12. An apparatus as defined in claim 7 wherein the battery string module selectively provides a boost current to the string of battery cells.

13. An apparatus as defined in claim 12 wherein the boost current delivered to each of the battery cells in the string is regulated by the logic circuit via the switching network.

14. An apparatus as defined in claim 13 wherein the switching network shunts at least a portion of the boost current to ground from at least one of the battery cells in the string.

15. An apparatus as defined in claim 13 wherein the regulation of the boost current delivered to each of the battery cells is at least partially based on temperature.

16. An apparatus as defined in claim 1 wherein the switching network comprises:
   a first connection between a first one of the controlled switches and a first terminal of a first one of the battery cells;
   a second connection between the first controlled switch and a first terminal of a second one of the battery cells;
   a third connection between a second one of the controlled switches and a second terminal of the first battery cell; and,
   a fourth connection between the second controlled switch and a second terminal of the second battery cell.

17. An apparatus as defined in claim 16 further comprising a discharge module for selectively connecting the switching network to a load for discharging the battery cell selected by the logic circuit.

18. An apparatus as defined in claim 17 wherein the discharge module is coupled to the first controlled switch and the second controlled switch is connected to ground such that the logic circuit can manipulate the first and second controlled switches to form: (1) a first discharge path comprising the discharge module, the load, the first battery cell and the first and second controlled switches, and (2) a second discharge path comprising the discharge module, the load, the second battery cell and the first and second controlled switches.

19. An apparatus as defined in claim 17 wherein the load comprises a test load.

20. An apparatus as defined in claim 1 wherein the logic circuit comprises a microprocessor.

21. An apparatus as defined in claim, 1 wherein the controlled switches comprise relays.

22. An apparatus as defined in claim, 1 wherein each of the controlled switches is connected to selectively form a circuit for shunting current to ground from an associated battery cell.

23. An apparatus as defined in claim 22 wherein the logic circuit is adapted to independently adjust the state of the controlled switches to vary the amount of current shunted to ground from the battery cells.

24. An apparatus as defined in claim 22 wherein the logic circuit is adapted to close at least one of the controlled switches to selectively discharge its associated battery cell.

25. An apparatus as defined in claim 22 wherein the logic circuit comprises a plurality of dual mode converters, each of the dual mode converters being associated with one of the controlled switches.

26. An apparatus as defined in claim 25 wherein at least one of the dual mode controllers limits the amount of current passed by its associated controlled switch.

27. An apparatus as defined in claim 22 wherein the controlled switches comprise FETs.

28. An apparatus as defined in claim 1 wherein, in the event of a failure of the primary power source while a battery cell is partially discharged from testing, the partially discharged battery joins the string of batteries in supplying current to the load bus.

29. An apparatus as defined in claim 28 wherein the battery string comprises Ni–cad batteries and wherein the partially discharged battery is driven towards zero volts.

30. An apparatus as defined in claim 28 wherein the battery string comprises Ni–cad batteries and at least one additional battery is added to the string of batteries to ensure sufficient back-up capacity at all times.

31. An apparatus for selectively testing first and second battery cells in a string of battery cells hard wired one cell to another and employed as a back-up power supply to a primary power source comprising:
   an isolation circuit for at least partially isolating the string of battery cells from the load bus while permitting current flow between the battery cells and the load bus in the event of a failure of the primary power supply;
   a switching network coupled to the battery cells in the string, the switching network including at least two controlled switches for selectively forming a first discharge circuit incorporating the first battery cell and a second discharge circuit incorporating the second battery cell while the cells remain connected in the string;
   a discharge module in circuit with the switching network to selectively connect the discharge circuit formed by the switching network to a load to discharge the battery cell incorporated therein; and,
   a logic circuit coupled to the controlled switches for controlling which of the first and second discharge circuits is formed by the switching network.

32. An apparatus as defined in claim 31 wherein the switching network comprises:
   a first connection between a first one of the controlled switches and a first terminal of the first battery cell;
   a second connection between the first controlled switch and a first terminal of the second battery cell;
   a third connection between a second one of the controlled switches and a second terminal of the first battery cell; and,
   a fourth connection between the second controlled switch and a second terminal of the second battery cell.

33. An apparatus as defined in claim 32 wherein the discharge module is coupled to the first controlled switch and the second controlled switch is connected to ground such that the logic circuit can manipulate the first and second controlled switches to form: (1) a first discharge path comprising the discharge module, the load, the first battery cell and the first and second controlled switches, and (2) a second discharge path comprising the discharge module, the load, the second battery cell and the first and second controlled switches.

34. An apparatus as defined in claim 33 wherein the first and second controlled switches comprise relays.

35. An apparatus for controlling current flow associated with first and second battery cells in a string of battery cells employed as a back-up power supply to a primary power source supplying power to a load via a load bus, the apparatus comprising:
   a first controlled switch coupled as a shunt across the first battery cell;
   a second controlled switch coupled as a shunt across the second battery cell;
   a logic circuit coupled to the first and second controlled switches for respectively controlling current flow through the first and second battery cells; and, a battery string module coupled to the load bus and to the string of battery cells, the battery string module including an isolation circuit for at least partially isolating the string of battery cells from the load bus while permitting current flow between the string and the load bus in the event of a failure of the primary power supply.

36. An apparatus as defined in claim 35 wherein the logic circuit is adapted to individually adjust a level of charging current presented to the first battery cell and a level of charging current presented to the second battery cell by respectively controlling the first and second controlled switches to selectively shunt a portion of the charging current to ground from the respective battery cell.

37. An apparatus as defined in claim 36 wherein the logic circuit comprises a plurality of dual mode converters, each of the dual mode converters being associated with one of the first and second controlled switches.

38. An apparatus as defined in claim 37 wherein the controlled switches comprise FETs.

39. An apparatus as defined in claim 36 wherein the logic circuit is adapted to discharge the first battery cell independently of the second battery cell via the first controlled switch.

40. An apparatus as defined in claim 35 wherein the logic circuit comprises a plurality of dual mode converters, each of the dual mode converters being associated with one of the first and second controlled switches.

41. An apparatus as defined in claim 35 wherein the controlled switches comprise FETs.

\* \* \* \* \*